United States Patent
Friebe et al.

(10) Patent No.: US 10,734,944 B2
(45) Date of Patent: Aug. 4, 2020

(54) INVERTER HAVING GRID DISCONNECTION POINT AND INSULATION RESISTANCE MEASUREMENT AND METHOD FOR MEASURING AN INSULATION RESISTANCE

(71) Applicant: SMA Solar Technology AG, Niestetal (DE)

(72) Inventors: Jens Friebe, Vellmar (DE); Burkard Mueller, Kassel (DE); Martin Putz, Kassel (DE)

(73) Assignee: SMA Solar Technology AG, Niestetal (DE)

(*) Notice: Subject to any disclaimer, the term of this patent is extended or adjusted under 35 U.S.C. 154(b) by 166 days.

(21) Appl. No.: 16/014,181

(22) Filed: Jun. 21, 2018

(65) Prior Publication Data

US 2018/0302030 A1  Oct. 18, 2018

Related U.S. Application Data

(63) Continuation of application No. PCT/EP2016/081568, filed on Dec. 16, 2016.

(30) Foreign Application Priority Data

Dec. 22, 2015 (DE) .................. 10 2015 122 636

(51) Int. Cl.
*H02S 50/10* (2014.01)
*G01R 31/42* (2006.01)
(Continued)

(52) U.S. Cl.
CPC ............ *H02S 50/10* (2014.12); *G01R 27/025* (2013.01); *G01R 27/18* (2013.01); *G01R 31/42* (2013.01); *G01R 31/44* (2013.01); *G01R 31/50* (2020.01)

(58) Field of Classification Search
CPC .................................................... G01R 27/025
(Continued)

(56) References Cited

U.S. PATENT DOCUMENTS 5,712,572 A * 1/1998 Tamechika ............. H02S 50/10
324/551
5,990,685 A * 11/1999 Nightall ................. G01R 27/18
324/509

(Continued)

FOREIGN PATENT DOCUMENTS

DE  102011018229 A1  10/2012
DE  102011122359 A1   6/2013
(Continued)

OTHER PUBLICATIONS

International Search Report dated Mar. 22, 2017 for International Application PCT/EP2016/081568.

*Primary Examiner* — Christopher E Mahoney
(74) *Attorney, Agent, or Firm* — Eschweiler & Potashnik, LLC

(57) ABSTRACT

An inverter including a circuit arrangement configured to measure an insulation resistance is disclosed. The inverter includes at least one half-bridge including at least two switching elements extending between respective end points, and a grid disconnection point comprising a series circuit comprised of two disconnection devices. The series circuit is arranged between a center point of the half-bridge and an AC voltage terminal of the inverter, which AC voltage terminal is configured to connect to a phase conductor or a neutral conductor of an AC voltage grid. The circuit arrangement includes a resistor and a voltage measurement apparatus. The resistor is arranged electrically in parallel with one of the disconnection devices and the voltage measurement apparatus is arranged electrically between the output-side terminal of the resistor and one of the end points of the half-bridge.

8 Claims, 4 Drawing Sheets

(51) Int. Cl.
   *G01R 31/50*   (2020.01)
   *G01R 31/44*   (2020.01)
   *G01R 27/18*   (2006.01)
   *G01R 27/02*   (2006.01)

(58) Field of Classification Search
   USPC .......................................................... 324/551
   See application file for complete search history.

(56) References Cited

U.S. PATENT DOCUMENTS 8,779,630  B2      7/2014   Prior
   8,860,430  B2     10/2014   Takafumi
   2007/0285102  A1  12/2007   Muller
   2008/0203820  A1*  8/2008   Kramer ..................... H02J 3/38
                                                        307/64
   2008/0285317  A1* 11/2008   Rotzoll ................. H02M 7/493
                                                        363/80
   2012/0223734  A1*  9/2012   Takada ................... H02S 50/10
                                                        324/761.01
   2015/0084654  A1   3/2015   Mueller
   2016/0099569  A1   4/2016   Rilling

FOREIGN PATENT DOCUMENTS

EP          1887675  A2    2/2008
   EP          2515404  A2   10/2012
   EP          2677330  A1   12/2013

* cited by examiner

US 10,734,944 B2

INVERTER HAVING GRID DISCONNECTION POINT AND INSULATION RESISTANCE MEASUREMENT AND METHOD FOR MEASURING AN INSULATION RESISTANCE

CROSS REFERENCE TO RELATED APPLICATIONS

This application is a continuation of International Patent Application number PCT/EP2016/081568, filed on Dec. 16, 2016, which claims priority to German Patent Application number 10 2015 122 636.7, filed on Dec. 22, 2015, and is hereby incorporated by reference in its entirety.

FIELD

The disclosure relates to an inverter for converting electrical power of an energy generation unit and feeding the converted electrical power into an energy supply grid, wherein the inverter comprises a grid disconnection point and a circuit arrangement for insulation resistance measurement, and to a method for measuring an insulation resistance for use in an inverter.

BACKGROUND

Inverters can convert electrical power of an energy generation unit from direct current to alternating current and feed it into an energy supply grid, for example an AC voltage grid, and/or supply it directly to an electrical load for the operation thereof. The energy generation unit used in this case can be, in particular, generators, which generate electrical power from renewable sources, for example photovoltaic generators or wind generators.

For the connection of an inverter to an AC voltage grid, it is necessary, for normative reasons, to make it possible to disconnect the energy generation unit from the AC voltage grid with galvanic isolation and single-fault safety. Disconnection of this kind can be ensured, for example, by way of a grid disconnection point disclosed in EP 2 228 895 A1, which has two relays connected in series.

EP 1 857 825 A1 discloses a measurement arrangement comprising a grounding point for identifying the insulation resistance of a live electrical apparatus or an installation comprising a supply voltage comprising a positive pole and a negative pole. In this case, two switches or one corresponding changeover switch are provided, which each establish a current path between one of the two poles and a grounding point in order to identify the total insulation resistance resulting in the event of the occurrence of one or more insulation faults with any desired potential reference. In order to identify the insulation resistance, two successive measurements are performed, wherein, in the first of these measurements, the first switch is closed while the second switch is open, and wherein, in the second of these measurements, the first switch is open while the second switch is closed. During the measurements, the current flowing via the respectively established connection to the grounding point is measured. The insulation resistance is calculated from the two measured currents, in respect of which the cited document provides a detailed instruction.

WO 2013/178654 A1 discloses an inverter comprising at least one half-bridge having two active switching elements for driving an output current and comprising an apparatus for measuring an insulation resistance, wherein the apparatus successively establishes a connection of the two ungrounded poles of a link circuit voltage of the inverter to a grounding point and measures a current flowing to the grounding point via the connection. The apparatus has a ground switch, which can be used to connect a center point of the half-bridge, which center point is located between the switching elements, to the grounding point. The apparatus connects the center point, which is connected to the grounding point, by means of the switching elements of the half-bridge successively to the two poles of the link circuit voltage of the inverter applied to the half-bridge, in order to establish the connection for measuring the current flowing to the grounding point.

DE 10 2011 018 229 A1 discloses a circuit arrangement for the potential isolation of an inverter of an energy generation installation from a grid, which circuit arrangement comprises a series circuit composed of two switching elements, wherein a measurement device for detecting a potential or a potential shift at the center contact is provided between the two switching elements of the series circuit.

DE 10 2013 104 629 A1 discloses an energy generation device comprising a converter and a disconnection device for the potential isolation of the converter from a grid, wherein the disconnection device comprises a series circuit composed of two switch elements. The energy generation device can comprise an insulation measurement device in order to recognize a fault in one of the switch elements based on an insulation resistance determined by the insulation measurement device while the respective other of the switch elements is actuated to close.

DE 10 2011 122 359 A1 discloses an inverter, the output-side phase conductor of which is guided in each case via a series circuit composed of two switching contacts, wherein the values of the voltages on the phase conductors can be detected by means of measurement apparatuses, and a method for checking the function of electromechanical switches.

The known measurement arrangements can be specifically provided for monitoring a photovoltaic installation which feeds electrical energy from a photovoltaic generator into an AC grid for an insulation fault. The components to be provided in an inverter for forming the known measurement arrangements are numerous and increase the overall costs of the inverter considerably.

SUMMARY

The disclosure is directed to an inverter comprising a circuit arrangement for measuring an insulation resistance and a method for identifying an insulation resistance of an inverter, using which inverter and method it is possible to actively measure the insulation resistance using a lower number of additional components and thus in a cost-effective manner.

An inverter according to the disclosure comprising a circuit arrangement for measuring an insulation resistance comprises at least one half-bridge comprising at least two switching elements and a grid disconnection point comprising a series circuit composed of two disconnection devices, wherein the series circuit is arranged between a center point of the half-bridge and an AC voltage terminal of the inverter, which AC voltage terminal is provided for connection of a phase conductor or a neutral conductor of an AC voltage grid. The circuit arrangement for measuring the insulation resistance comprises a resistor and a voltage measurement apparatus, wherein the resistor is arranged electrically in parallel with one of the disconnection devices and the voltage measurement apparatus is arranged between the output-side terminal of the resistor and one of the end points of the half-bridge.

This solution is based on an appreciation that it is not absolutely necessary to perform a voltage or current measurement with respect to the ground or protective conductor in order to identify the insulation resistance of the inverter, as is known from the prior art. Instead, it proves to be advantageous to supplement components of the inverter that are present anyway, namely the disconnection devices of the grid disconnection point, with a measurement resistor and to utilize said components in such a way that a voltage measurement is performed with respect to a phase conductor or a neutral conductor of the AC voltage grid. Said measurement can be used for identifying the insulation resistance when and insofar as the potential difference between the phase conductor or the neutral conductor and the ground or protective conductor is close to zero or at least substantially constant and moves within the scope of the input voltage applied to the half-bridge of the inverter. Particularly for frequencies significantly below the grid frequency and even more so for DC voltages at a frequency equal to zero, the potential difference between the phase conductor or the neutral conductor and the ground or protective conductor regularly fulfills the mentioned condition, which can furthermore be verified using simple means based on an additional measurement of the potential difference between the ground or protective conductor and the end point of the half-bridge used to identify the insulation resistance.

In one embodiment of the inverter, the disconnection devices can be embodied as relays in order to make it possible to galvanically isolate an energy generation unit arranged on the DC voltage side of the inverter from the AC voltage grid. In this case, the disconnection devices can be arranged in the form of a series circuit between the center point of the half-bridge and the AC voltage terminal, in particular in order to make a compact design of the grid disconnection point possible. The resistor can be arranged in parallel with a first disconnection device and in parallel with a second disconnection device of the series circuit. The voltage measurement apparatus can be arranged between the output-side terminal of the resistor and one of the terminals of the DC link circuit selectively, that is to say between the output-side terminal of the resistor and the end point associated with a positive terminal of a DC link circuit or the end point of the half-bridge associated with a negative terminal of the DC link circuit.

In a specific embodiment, the inverter is configured to feed electrical power from an energy source that can be connected to the end points of the half-bridge into an AC voltage grid that can be connected to the AC voltage terminal of the inverter. This means that the electrical power to be fed in flows via the grid disconnection point, the disconnection devices of which have to be switched to a conducting state for this purpose. Concurrently, for the purpose of measuring the insulation resistance, the disconnection devices of the grid isolation point have a switching state, which does not make any sense in conventional inverters, by virtue of one of the disconnection devices connected in series being in a non-conducting state and a further disconnection device being in a conducting state.

A method according to the disclosure relates to an inverter comprising at least one half-bridge, which has at least two switching elements, a DC link circuit arranged in parallel with the half-bridge and comprising a first and a second pole, a grid disconnection point, which has a series circuit composed of two disconnection devices, wherein the series circuit is arranged between a center point of the half-bridge and an AC voltage terminal, which AC voltage terminal is provided for connection of a phase conductor or a neutral conductor of an AC voltage grid, and a circuit arrangement for identifying an insulation resistance. The circuit arrangement comprises a resistor arranged electrically in parallel with one of the disconnection devices. The method comprises a first act where one of the disconnection devices with which the resistor is arranged in parallel is switched to a non-conducting state and the other of the disconnection devices is switched to a conducting state. In this switching state, a first voltage value of a voltage dropped between an output-side terminal of the resistor and a first pole of the DC link circuit is measured while the first pole of the DC link circuit is connected to the AC voltage terminal, and a second voltage value of the voltage dropped between the output-side terminal of the resistor and the first pole of the DC link circuit is measured while the second pole of the DC link circuit is connected to the AC voltage terminal. The insulation resistance is then identified depending on the measured voltage values. The order in which the first voltage value and the second voltage value are determined is arbitrary here.

In one embodiment of the method, the first pole and the second pole of the DC link circuit are each connected to the AC voltage terminal by virtue of a first and a second of the switching elements of the half-bridge being respectively switched to a conducting state. The first pole and the second pole of the DC link circuit can be connected to the AC voltage terminal in alternating fashion and, in particular, repeatedly at a frequency below the grid frequency of the AC voltage grid by at least a factor of 10, wherein grid-frequency components can also be filtered out from the voltage measurement values during the measurement of the first and the second voltage value.

BRIEF DESCRIPTION OF THE FIGURES

The following text further explains and describes the disclosure with reference to exemplary embodiments illustrated in the figures.

DETAILED DESCRIPTION

Figure 1:
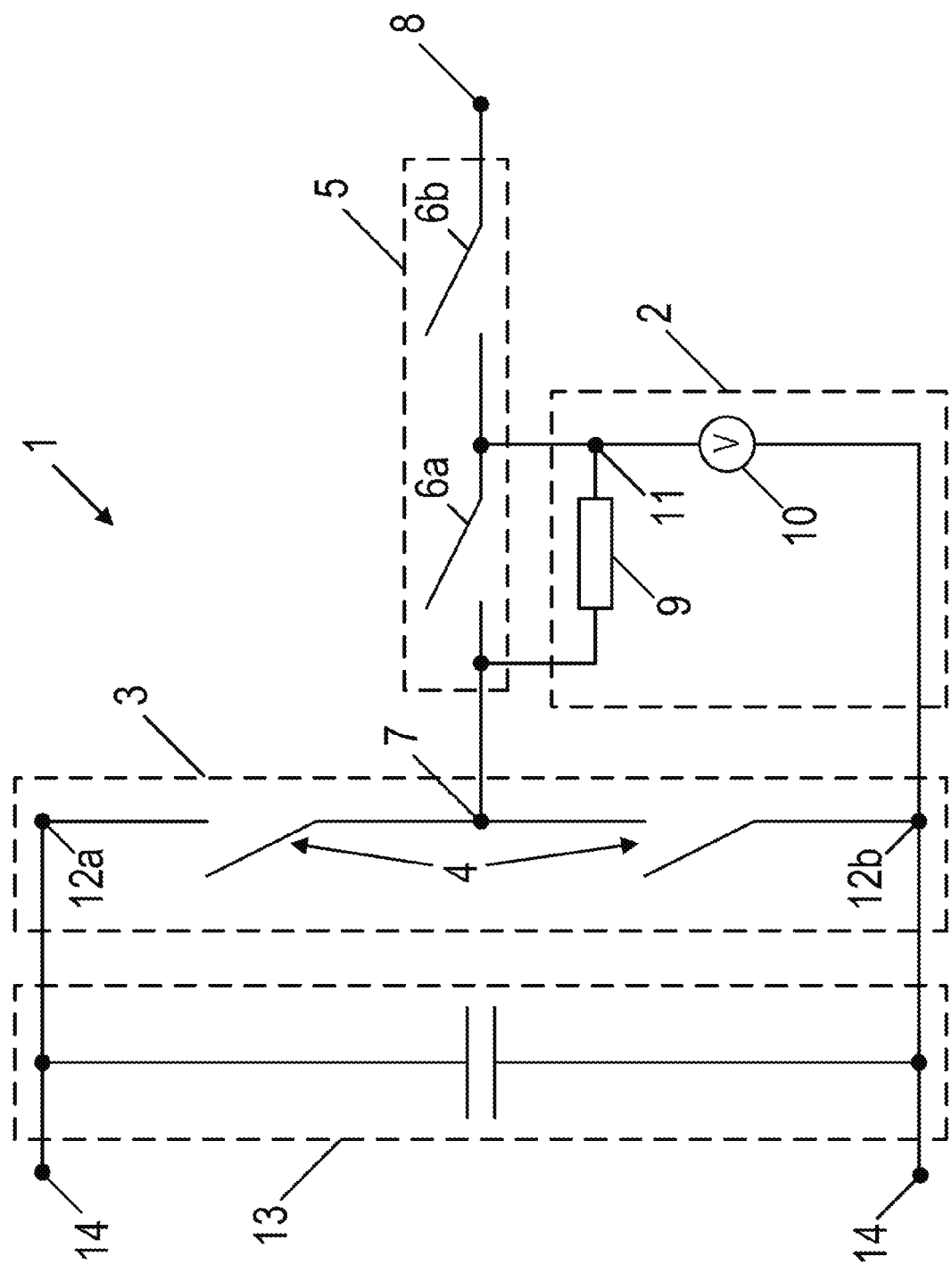
FIG. 1 shows a first embodiment of an inverter according to the disclosure comprising a grid disconnection point and a circuit arrangement for identifying an insulation resistance.

FIG. 1 shows an inverter 1 according to the disclosure, which has input-side DC voltage terminals 14 to which a DC voltage source, for example a photovoltaic generator, can be connected, wherein the DC voltage source can be connected to the inverter 1 directly or via an interconnected DC voltage converter. A DC link circuit 13 serves for buffer storage of the electrical power fed into the inverter 1 via the DC voltage terminals 14. A half-bridge 3 comprising two switching elements 4 connected electrically in series is arranged in parallel with the DC link circuit 13, wherein end points 12a, 12b of the half-bridge 3 are each connected to the poles of the DC link circuit 13 and the DC voltage terminals 14. By way of clocked, in particular reciprocal, switching of the switching elements 4, a DC voltage applied to the DC voltage terminals 14 can be converted to a clocked AC voltage, which can be tapped at the center point 7 of the half-bridge 3, with the result that, after smoothing by means of output filters (not illustrated here), a sinusoidal alternating current can be generated and can be fed into an AC voltage grid (not illustrated here) via an AC voltage terminal 8. A disconnection point 5 is provided to disconnect the inverter 1 from the AC voltage grid, which disconnection point is arranged between the center point 7 of the half-bridge 3 and the AC voltage terminal 8. For normative reasons, in particular to ensure the so-called single-fault safety, a disconnection point of this kind, is regularly composed of at least two disconnection devices 6a, 6b connected electrically in series, in particular in transformerless inverters.

To identify an insulation resistance of the inverter 1, a circuit arrangement 2 comprising a resistor 9 and a voltage measurement apparatus 10 is provided. The resistor 9 is arranged in parallel with the bridge-side disconnection element 6a of the grid isolation point 5. The voltage measurement apparatus 10 is arranged between an output-side terminal 11 of the resistor 9 and the end point 12b of the half-bridge 3.

Figure 2:
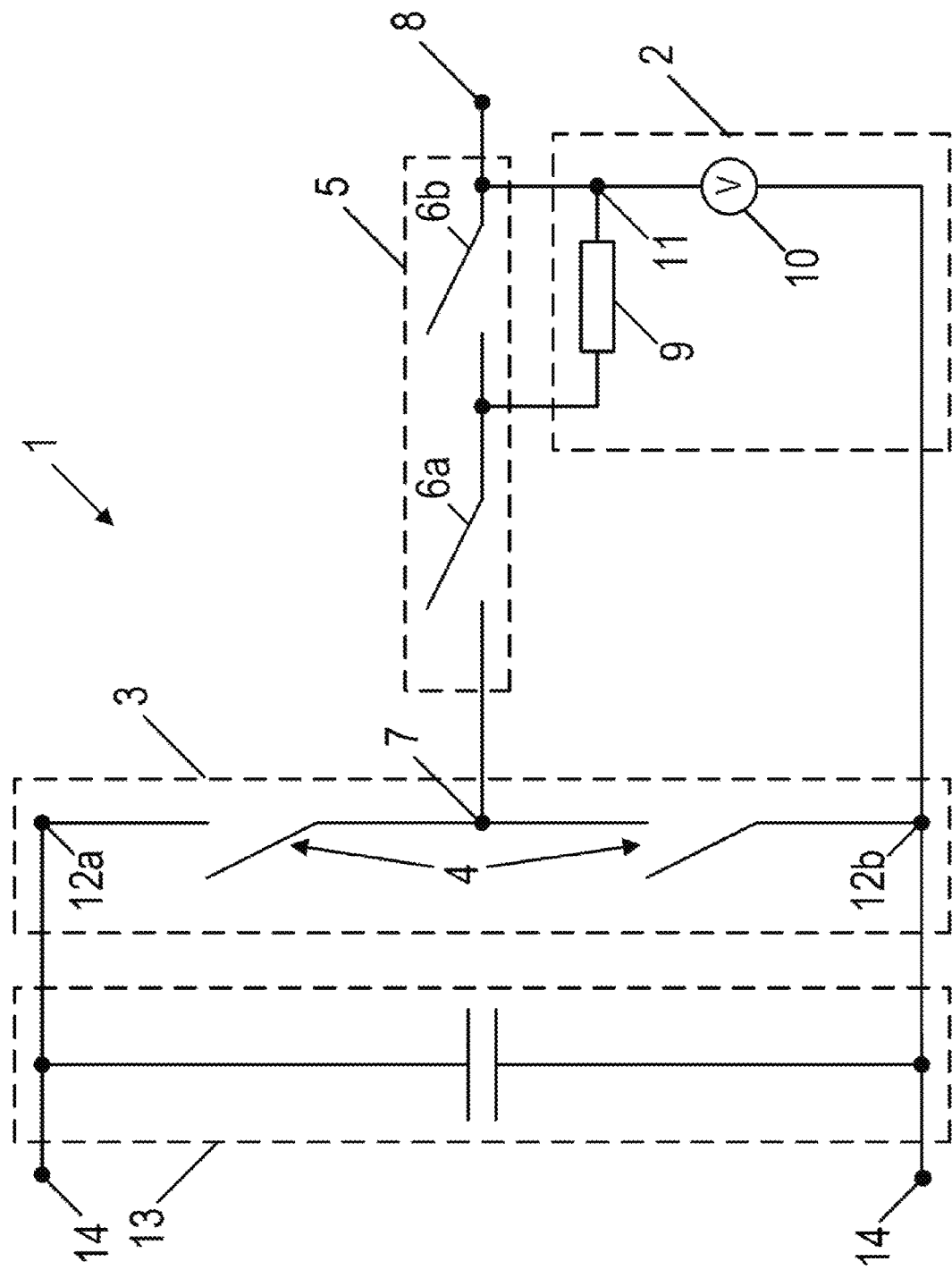
FIG. 2 shows a second embodiment of an inverter according to the disclosure.

FIG. 2 shows an alternative embodiment of an inverter 1 according to the disclosure. In contrast to FIG. 1, in accordance with FIG. 2, the resistor 9 is arranged in parallel with the output-side disconnection device 6b. The voltage measurement apparatus 10 is furthermore arranged between the output-side terminal 11 of the resistor 9 and the end point 12b of the half-bridge 3.

Figure 3:
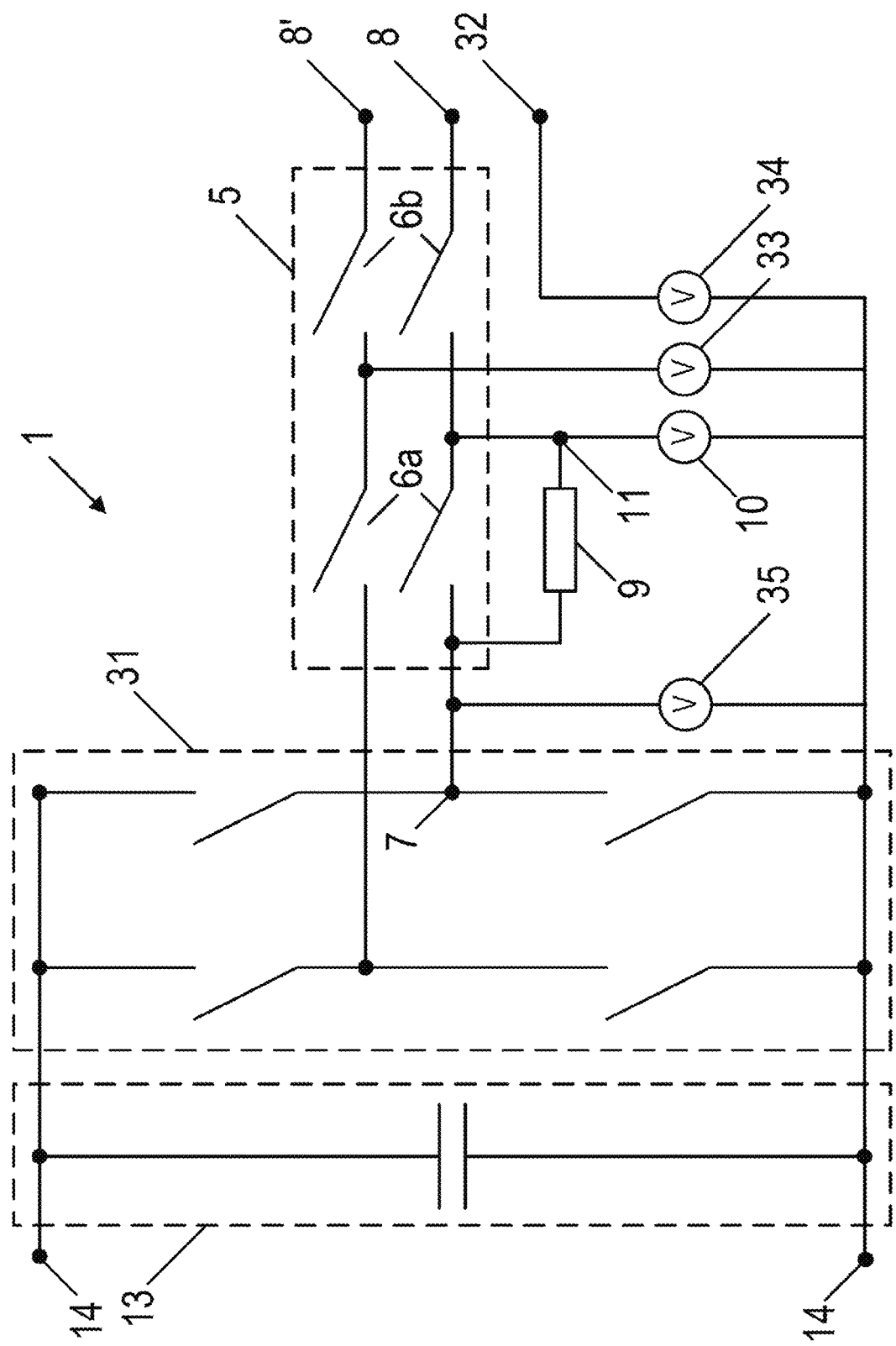
FIG. 3 shows a third embodiment of an inverter according to the disclosure.

FIG. 3 shows a further embodiment of the inverter 1. In this embodiment, the inverter comprises an inverter bridge 31, which in this case is designed as a H4-bridge comprising two half-bridges each comprising two switching elements and which can output electrical power, which is provided by a generator that can be connected to the DC voltage terminals 14, as an alternating current via the AC voltage terminals 8, 8' and feed it into an AC voltage grid that can be connected to said terminals. The AC voltage terminals 8, 8' are provided here for the connection of a phase conductor and a neutral conductor of the AC voltage grid and can be disconnected from the inverter bridge 31 and hence from the generator by means of the grid disconnection point 5, wherein in each case two disconnection devices 6a, 6b connected in series are provided for the AC voltage terminals 8, 8'. A PE terminal 32 can be provided for the connection of a protective or ground conductor (PE conductor) of the AC voltage grid. To identify the insulation resistance, a resistor 9 arranged in parallel with one of the inverter-side disconnection devices 6a is provided, wherein a voltage measurement apparatus 10 is arranged between the output-side terminal of the resistor 9 and an end point of the inverter bridge 31 (cf. FIG. 1). Further voltage measurement devices 33, 34, 35 can be provided in order to detect voltages between an end point of the inverter bridge 31 and the AC voltage terminal 8', the PE conductor or a center point between a branch of the inverter bridge 31 and the grid disconnection point 5.

The grid disconnection point 5 is configured to separate a DC voltage source connected to the DC voltage terminals 14 off from the AC voltage terminal 8 in such a way that galvanic isolation is ensured even in the case of a possible failure of one of the disconnection devices 6a, 6b, that is to say in the case of one of the disconnection devices 6a, 6b permanently remaining in a conducting state. Said so-called single-fault safety can also be achieved by the output-side disconnection device 6b being divided into two individual disconnection devices in a manner deviating from the configuration in accordance with FIGS. 2 and 3, said two individual disconnection devices each being arranged in the DC lines between the DC terminals 14 and the end points of the half-bridge 3 or the inverter bridge 31. This can also ensure that the DC voltage source is isolated from the AC voltage terminals 8, 8' at all poles, even when one of the remaining disconnection devices 6a, 6b can no longer be opened on account of a possible fault state. This arrangement can also advantageously protect the half-bridge 3 or the inverter bridge 31 from overvoltages arising on the DC voltage side. Other than that, a "divided" design of the grid isolation point 5 of this kind that is equivalent to FIG. 3 still concerns a series circuit of a first, DC-side disconnection device and a second, grid-side disconnection device, wherein an inverter bridge circuit 31 is arranged between the first and the second disconnection device. It should be mentioned in this regard that the resistor 9, when selected appropriately, in particular in the case of a sufficiently high resistance value, likewise fulfills the demand for galvanic isolation, in particular when a protective resistor is used as the resistor 9.

The resistor 9 can also be formed by an appropriate configuration of the voltage measurement apparatuses 10 and 35. These voltage measurement apparatuses 10 and 35 have internal resistances, which, in combination with one another, can produce the same effect as a separate resistor 9 with respect to identifying the insulation resistance, with the result that a dedicated resistor 9 can be omitted in this case.

It goes without saying that, as an alternative to the H4-bridge illustrated in FIG. 3, the inverter bridge 31 can also be embodied as a so-called H5-bridge in accordance with DE 10 2004 030 912 A1 or can have a freewheel in accordance with EP 1 369 985 A1, wherein the H5-bridge and freewheel details are incorporated by reference. Moreover, the inverter bridge 31 can be embodied in a three-phase manner, with the result that the inverter 1 can feed a three-phase current into a three-phase AC voltage grid. The individual half-bridges 3 of the inverter 1 can be embodied as 3-level or multilevel half-bridges, wherein the DC link circuit 13 can have a plurality of capacitances and possibly a center point tap.

Figure 4:
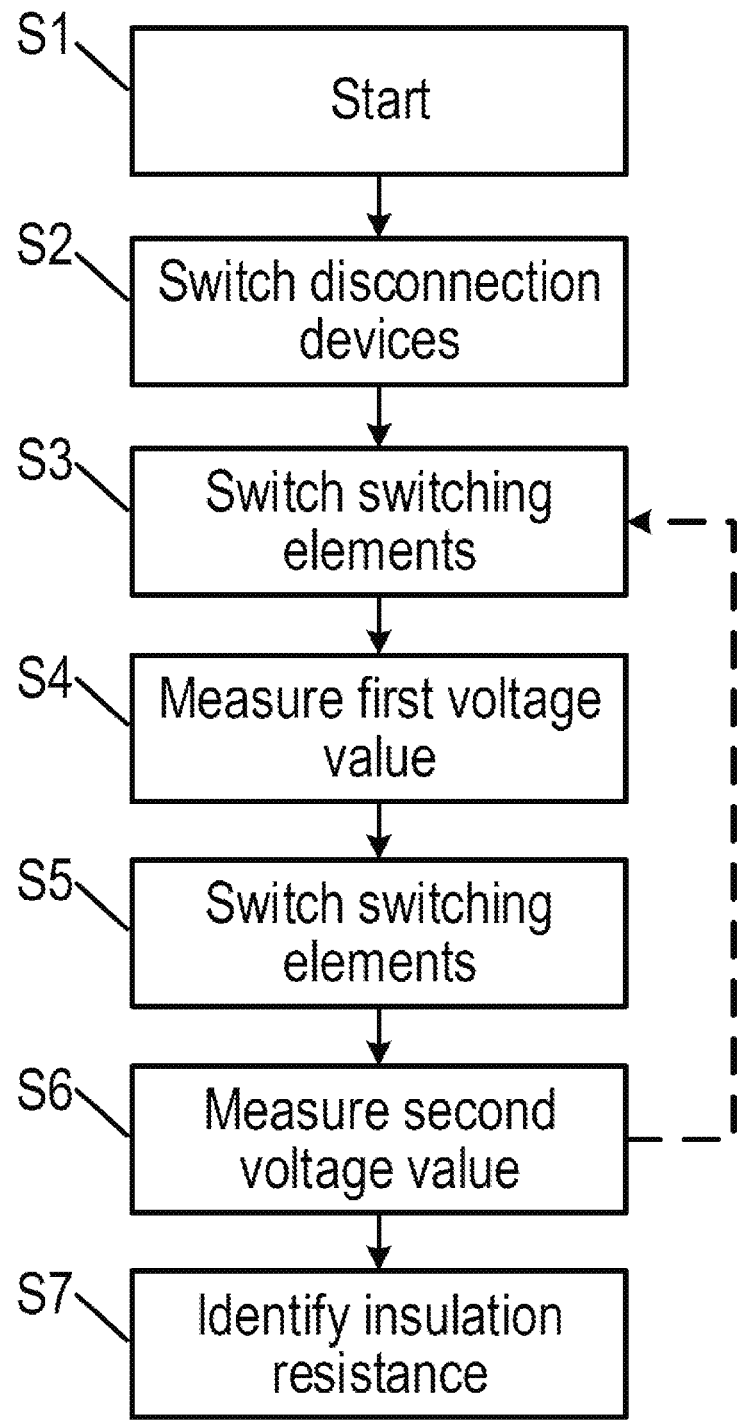
FIG. 4 shows a block diagram for visualizing an embodiment of the method according to the disclosure.

FIG. 4 shows a block diagram for visualizing an embodiment of the method according to the disclosure. After a start of the inverter 1 at S1, in S2, the disconnection devices 6a, 6b are switched in such a way that one of the disconnection devices 6a, 6b with which the resistor is arranged in parallel is in a non-conducting state and the other of the disconnection devices 6b, 6a is in a conducting state. At S3, the switching elements 4 of the half-bridge 3 or the inverter bridge 31 are switched in such a way that a first pole 12a or 12b of the DC link circuit 13 is connected to the AC voltage terminal 8 such that, in S4, a first voltage value of a voltage V dropped between an output-side terminal 11 of the resistor 9 and the first pole 12a or 12b, respectively, of the DC link circuit 13 can be measured. In step S5, the switching elements 4 of the half-bridge 3 or the inverter bridge 31 are switched in such a way that the second, that is to say the other, pole 12b or 12a, respectively, of the DC link circuit 13 is connected to the AC voltage terminal 8 such that, in S6, a second voltage value of the voltage V dropped between the output-side terminal 11 of the resistor 9 and the first pole 12a or 12b, respectively, of the DC link circuit 13 can be measured. The insulation resistance of the inverter can then be identified at S7 in a known manner from the measured voltage values. Acts S3 to S6 can optionally be performed multiple times in the form of a loop, wherein the duration of one iteration can be longer than a grid period at least by the factor of 10.

The invention claimed is:

1. An inverter comprising a circuit arrangement configured to measure an insulation resistance, wherein the inverter comprises:
   at least one half-bridge comprising at least two switching elements extending between respective end points; and
   a grid disconnection point comprising a series circuit comprised of two disconnection devices,
   wherein the series circuit is arranged between a center point of the half-bridge and an AC voltage terminal of the inverter, which AC voltage terminal is configured to connect to a phase conductor or a neutral conductor of an AC voltage grid, and
   wherein the circuit arrangement comprises a resistor and a voltage measurement apparatus, and wherein the resistor is arranged electrically in parallel with one of the disconnection devices and the voltage measurement apparatus is arranged electrically between the output-side terminal of the resistor and one of the end points of the half-bridge.

2. The inverter as claimed in claim 1, wherein the disconnection devices comprise relays.

3. The inverter as claimed in claim 1, wherein the resistor is arranged in parallel with a first disconnection device or in parallel with a second disconnection device of the series circuit between the center point of the half-bridge and the AC voltage terminal.

4. The inverter as claimed in claim 1, wherein the voltage measurement apparatus is arranged between the output-side terminal of the resistor and the end point of the half-bridge associated with a positive terminal of a DC link circuit or the end point of the half-bridge associated with a negative terminal of the DC link circuit.

5. The inverter as claimed in claim 1, wherein the inverter is configured to feed electrical power from an energy source that is configured to connect to the end points of the half-bridge into an AC voltage grid that is configured to connect to the AC voltage terminal of the inverter.

6. A method for identifying an insulation resistance of an inverter comprising at least one half-bridge, which comprises at least two switching elements,
   a DC link circuit arranged in parallel with the half-bridge and comprising a first and a second pole at first and second end points, respectively, a grid disconnection point, which comprises a series circuit composed of two disconnection devices, wherein the series circuit is arranged between a center point of the half-bridge and an AC voltage terminal of the inverter, which AC voltage terminal is configured to connect to a phase conductor or a neutral conductor of an AC voltage grid, and a circuit arrangement configured to identify an insulation resistance, which circuit arrangement comprises a resistor arranged electrically in parallel with one of the disconnection devices, the method comprising:
   switching a one of the disconnection devices that is in parallel with the resistor to a non-conducting state, and an other of the disconnection devices to a conducting state;
   measuring a first voltage value of a voltage dropped between an output-side terminal of the resistor and the first pole of the DC link circuit while the first pole of the DC link circuit is connected to the AC voltage terminal;
   measuring a second voltage value of the voltage dropped between the output-side terminal of the resistor and the first pole of the DC link circuit while the second pole of the DC link circuit is connected to the AC voltage terminal; and
   identifying the insulation resistance depending on the measured voltage values.

7. The method as claimed in claim 6, wherein the first pole and the second pole of the DC link circuit are each connected to the AC voltage terminal by virtue of a first and a second of the switching elements of the half-bridge being switched to a conducting state, respectively.

8. The method as claimed in claim 6, wherein the first pole and the second pole of the DC link circuit are connected to the AC voltage terminal in alternating fashion at a frequency below the grid frequency by at least a factor of 10, thereby filtering out grid-frequency components during the measurement of the first and the second voltage value.

* * * * *